(12) United States Patent
Lee

(10) Patent No.: US 7,647,568 B2
(45) Date of Patent: Jan. 12, 2010

(54) MANUFACTURING METHOD OF MASK AND OPTIMIZATION METHOD OF MASK BIAS

(75) Inventor: Jun Seok Lee, Goyang-si (KR)

(73) Assignee: Dongbu Hitek Co., Ltd., Seoul (KR)

( * ) Notice: Subject to any disclaimer, the term of this patent is extended or adjusted under 35 U.S.C. 154(b) by 63 days.

(21) Appl. No.: 11/779,968

(22) Filed: Jul. 19, 2007

(65) Prior Publication Data

US 2008/0022256 A1    Jan. 24, 2008

(30) Foreign Application Priority Data

Jul. 21, 2006 (KR) ...................... 10-2006-0068698

(51) Int. Cl.
G06F 17/50 (2006.01)

(52) U.S. Cl. ............................. 716/2; 716/19

(58) Field of Classification Search ...................... 716/2, 716/19
See application file for complete search history.

(56) References Cited

U.S. PATENT DOCUMENTS

| | | | | |
|---|---|---|---|---|
| 5,682,323 | A * | 10/1997 | Pasch et al. ................... | 716/19 |
| 6,033,811 | A * | 3/2000 | Lee ............................... | 430/5 |
| 6,194,104 | B1 * | 2/2001 | Hsu ............................... | 430/5 |
| 6,622,547 | B1 * | 9/2003 | Phan et al. ..................... | 73/105 |
| 2004/0019869 | A1 * | 1/2004 | Zhang .......................... | 716/11 |
| 2005/0142454 | A1 * | 6/2005 | Fujimoto et al. ............... | 430/5 |
| 2005/0250022 | A1 * | 11/2005 | Kotani et al. .................... | 430/5 |
| 2005/0280800 | A1 * | 12/2005 | Laiding et al. ................. | 355/77 |
| 2006/0048091 | A1 * | 3/2006 | Joshi et al. ...................... | 716/21 |
| 2006/0143172 | A1 * | 6/2006 | Ashida et al. ................... | 707/6 |
| 2006/0277520 | A1 * | 12/2006 | Gennari ......................... | 716/21 |
| 2007/0240088 | A1 * | 10/2007 | Tang et al. ....................... | 716/9 |
| 2008/0295061 | A1 * | 11/2008 | Eisenmann et al. ............ | 716/21 |

OTHER PUBLICATIONS

Baracchi et al.; "Definition of New Quality Criteria and Assessment Means for Masks at 150 nm Design Rules and Beyond"; 1999; SPIE vol. 3873; All pages.*
Lynn et al.; "Life is Better Without Non-orthogonal or Non-45-Degree Edges—A Practical Solution to Alleviate the Pain on OPC and Mask Writing"; 2002; SPIE vol. 4754; All pages.*
Stirniman et al.; "Quantifying proximity and related effects in advanced wafer processes"; 1995; SPIE vol. 2440; All pages.*

* cited by examiner

Primary Examiner—Jack Chiang
Assistant Examiner—Suresh Memula
(74) Attorney, Agent, or Firm—Saliwanchik, Lloyd & Saliwanchik

(57) ABSTRACT

In a fabrication method of a semiconductor device a manufacturing method of a mask and an optimization method of a mask bias incorporating an optical proximity correction are provided. The manufacturing method of the mask incorporating an optical proximity correction can form a pattern in an excellent quality in a dense area where a micro design pattern in an irregular array state is formed. Also, a desired design pattern can be formed using a mask according to embodiments of the present invention regardless of an array state.

8 Claims, 7 Drawing Sheets

MANUFACTURING METHOD OF MASK AND OPTIMIZATION METHOD OF MASK BIAS

CROSS-REFERENCE TO RELATED APPLICATION

The present application claims the benefit under 35 U.S.C. §119 of Korean Patent Application No. 10-2006-0068698, filed Jul. 21, 2006, which is hereby incorporated by reference in its entirety.

BACKGROUND

In general, a photolithography process refers to a process where a photoresist film is evenly applied on a wafer, patterned by an exposure process using a photo mask formed in a predetermined lay-out, and then developed to form a pattern in a specific shape in the exposed photoresist film.

The photolithography technique used in the photolithography process in the fabrication of the semiconductor device utilizes an elaborate mask design so that it can properly control the amount of light transparently emitted from the mask. To this end, an optical proximity correction (OPC) technique and a phase shifting mask technique have been developed, and various methods capable of minimizing the phenomenon of light distortion due to a pattern shape drawn in the mask have been sought.

In particular, as design rule minimum sizes have decreased for a high-integration of a semiconductor device, a defect occurring in a pattern due to an Optical Proximity Effect with an adjacent pattern in the photolithography process has become a problem.

In other words, when forming a pattern in a quadrangular shape, a corner-rounding phenomenon where a corner of the quadrangular pattern becomes round due to light diffraction and interference occurs. Also, differences in pattern density can create problems due to the optical proximity effect where the patterns in an area where the patterns are isolated (such as an isolation area) are patterned to be small in size as compared to that in an area where the patterns are dense (dense area).

Such a technique to form a mask pattern affects the accuracy of the patterns formed on the semiconductor substrate. In particular, if the optical proximity effect of the mask pattern is not properly considered, the distortion of a pattern critical dimension occurs differently from the original exposure intention of the lithography, thereby many bad effects on the characteristics of the semiconductor device may occur.

In particular, when a regular rule is not applied between the pattern intervals formed in a dense area, it causes a problem where the amount of database DB required exceedingly increases when manufacturing a semiconductor device using a photo mask.

BRIEF SUMMARY

Embodiments of the present invention provide a manufacturing method of a mask and an optimization method of a mask bias, incorporating optical proximity correction techniques so that a micropattern having an irregular interval can be formed in an excellent quality.

According to an embodiment of the present invention, there is provided a manufacturing method of a mask comprising the steps of: extracting from design patterns of a layer a reference pattern and a non-array pattern adjacent thereto; calculating correction bias maximum value Pmax and Qmax in the direction of the non-array pattern from a first corner of the reference pattern to a Y axis and a second corner of the reference pattern to an X axis, respectively; extracting a triangular intersection pattern formed by intersecting a reference line inclined at 45° from an X axis at the vertex of the reference pattern closest to the non-array pattern with the non-array pattern; if the lengths of the triangular intersection pattern are given as Δx and Δy, calculating actual correction bias values Preal and Qreal in the X and Y axis directions of the reference pattern with equations $$\frac{\Delta x}{x} = \frac{Preal}{P\max} \text{ and } \frac{\Delta y}{y} = \frac{Qreal}{Q\max},$$

where x is the X axis direction length of the non-array pattern and y is the Y axis direction length of the non-array pattern; and manufacturing a mask having an optical proximity corrected (OPC) mask pattern by applying the actual correction bias values Preal and Qreal from the first and second corner, respectively.

According to another embodiment of the present invention, there is provided an optimization method of a mask bias comprising the steps of: calculating an X axis and a Y axis correction bias maximum value Pmax and Qmax for a first corner and a second corner of a reference pattern adjacent to a non-array pattern; extracting a triangular intersection pattern formed by intersecting a reference line inclined at 45° from an X axis at the vertex of the reference pattern closest to the non-array pattern with the non-array pattern; and if the lengths of the triangular intersection pattern are given as Δx and Δy, calculating actual correction bias values Preal and Qreal in the X and Y axis directions of the reference pattern with equations $$\frac{\Delta x}{x} = \frac{Preal}{P\max} \text{ and } \frac{\Delta y}{y} = \frac{Qreal}{Q\max},$$

where x is the X axis direction length of the non-array pattern and y is the Y axis direction length of the non-array pattern.

DETAILED DESCRIPTION

Hereinafter, a manufacturing method of a mask and an optimization method of a mask bias according to embodiments of the present invention will be described in detail with reference to the accompanying drawings.

Figure 1A:
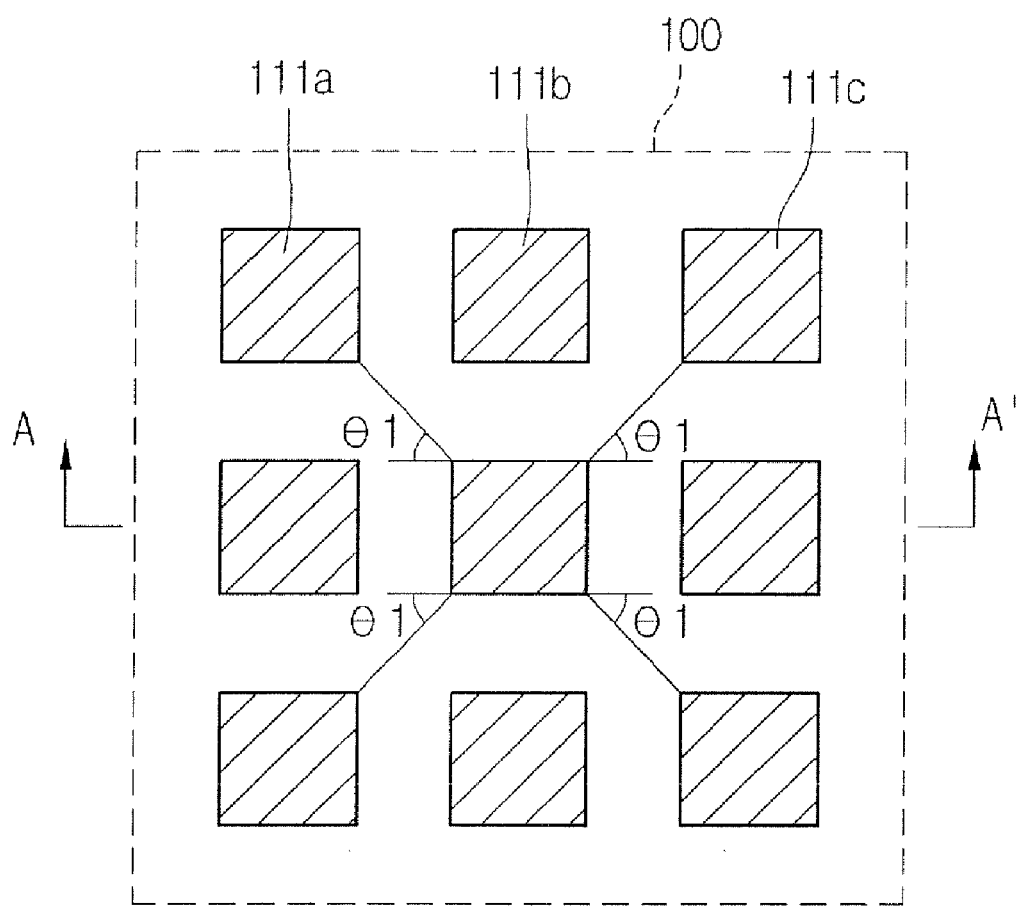
FIG. 1A is a plan view of a design pattern formed on a semiconductor substrate according to an embodiment of the present invention.
Figure 1B:
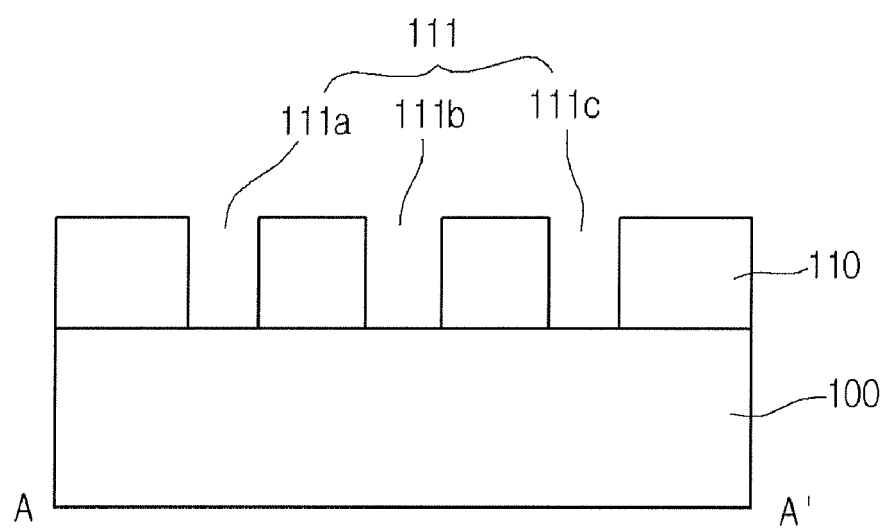
FIG. 1B is a cross-sectional view taken along line A-A' of FIG. 1A.

FIG. 1A is a plan view of a design pattern formed on a semiconductor substrate according to an embodiment of the present invention, and FIG. 1B is a cross-sectional view taken along line A-A' of FIG. 1A.

As shown in FIGS. 1A and 1B, design patterns 111a, 111b, and 111c are densely formed at a constant interval using a same design rule on an interlayer dielectric layer 110 on a semiconductor substrate 100.

For example, as shown in FIGS. 1A and 1B, design patterns 111a, 111b, and 111c can be, for example, of a quadrangular contact hole, and formed spaced by a predetermined interval in a 3×3 (length and width) array on a region of the substrate 100.

Although the design patterns are described as being formed on a substrate 100, the substrate can be a semiconductor substrate, a metal wiring, or a layer formed of an interlayer dielectric layer.

Figure 2:
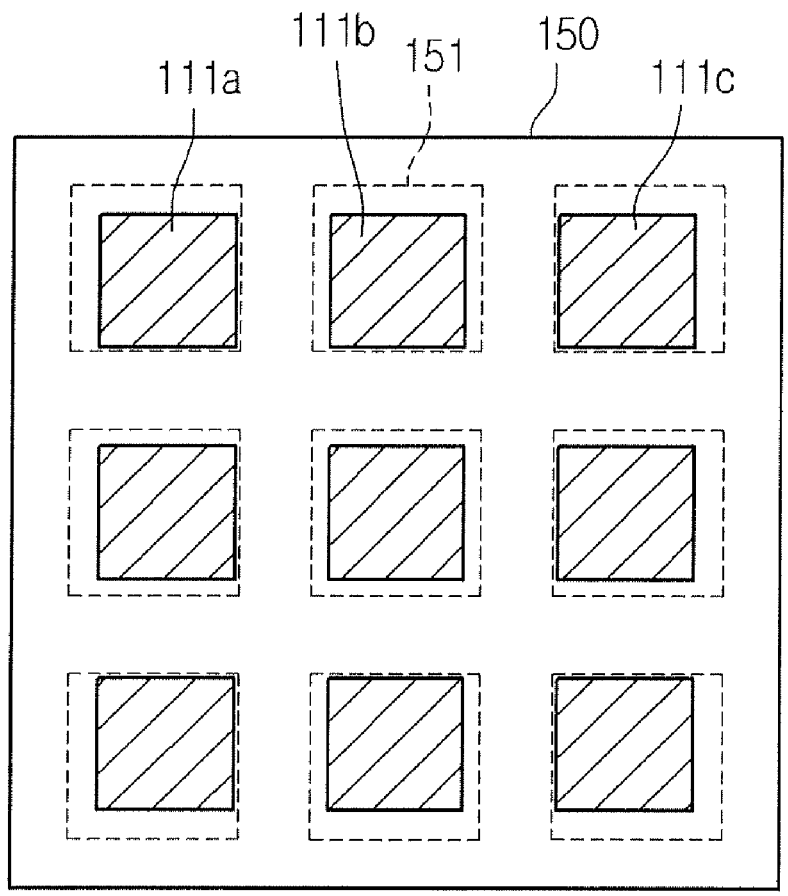
FIG. 2 is a plan view of a photo mask according to an embodiment of the present invention for forming the design pattern of FIG. 1A.

FIG. 2 is a plan view of a photo mask for forming the design pattern of FIG. 1A.

As shown in FIG. 2, in order to form a design pattern on a substrate, the photo mask 150 according to an embodiment of the present invention is provided with a mask pattern 151 formed at locations corresponding to the design patterns 111a, 111b, and 111c.

In order to suppress the optical proximity effect of the design patterns 111a, 111b, and 111c and improve resolution thereof, the design of the mask pattern 151 is made by applying an Optical Proximity Correction (OPC) method.

According to an embodiment, when the design pattern 111 is regularly disposed, the optical proximity effect can be selectively bias-corrected depending on the intervals between adjacent patterns.

Figure 3:
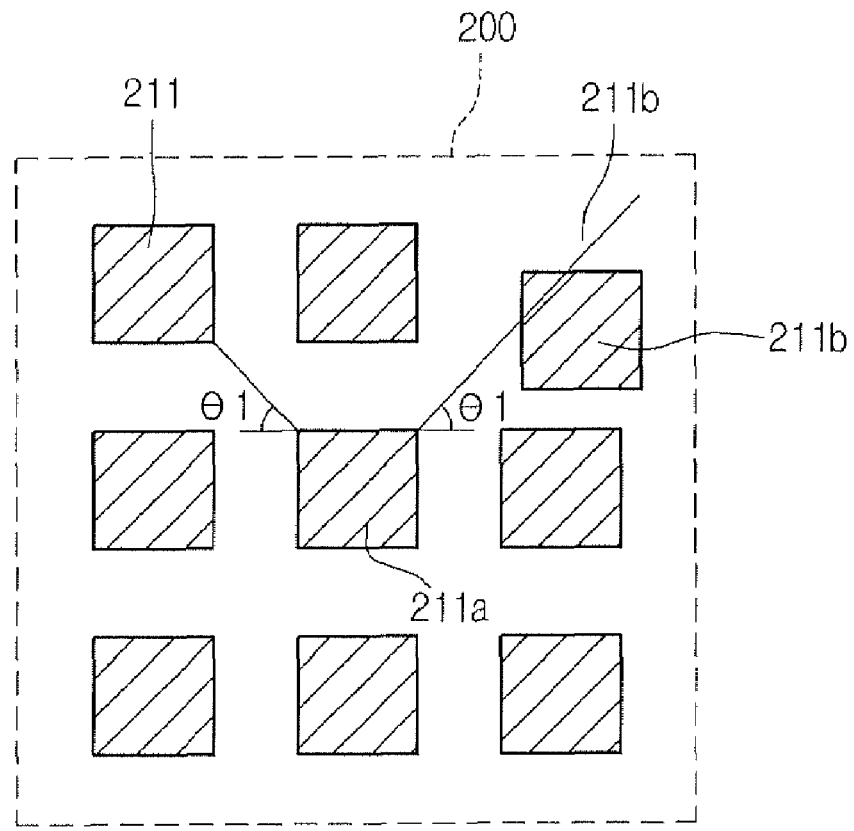
FIG. 3 is a plan view of a design pattern formed on a substrate according to another embodiment of the present invention.
Figure 4:
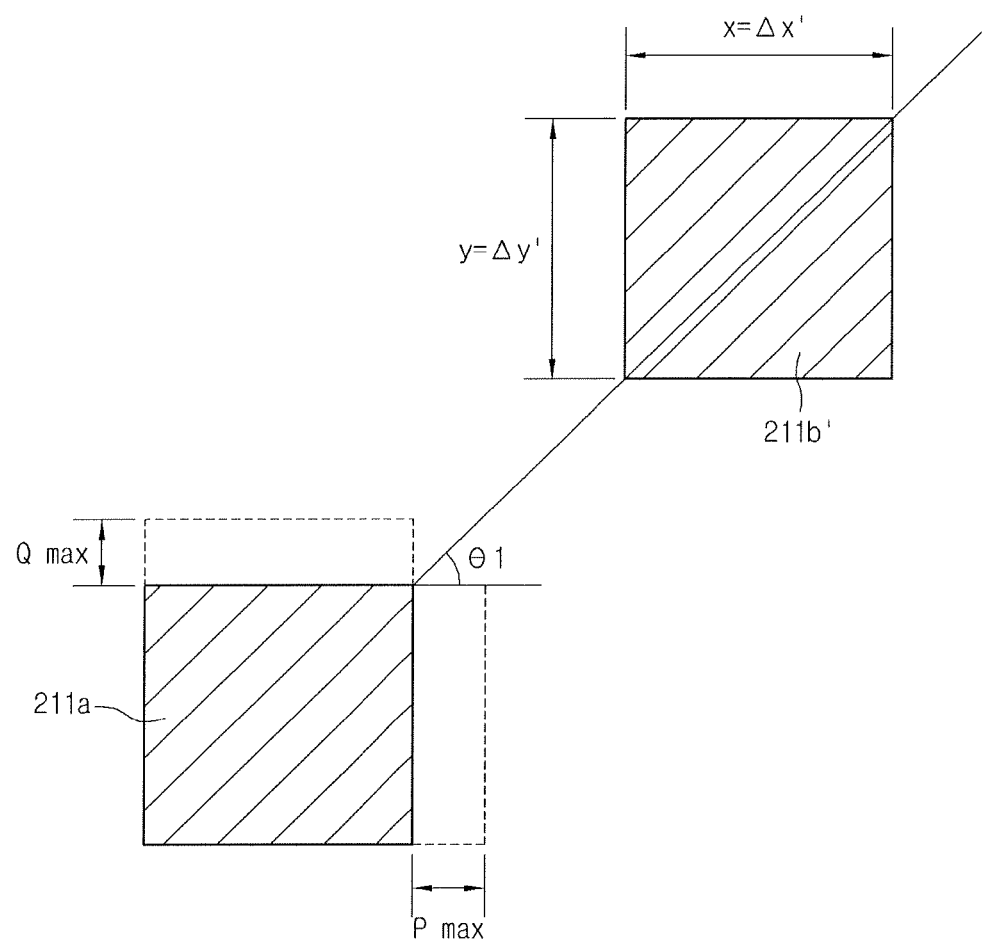
FIGS. 4 and 5 are views of an optimization method of a mask bias according to embodiments of the present invention.
Figure 5:
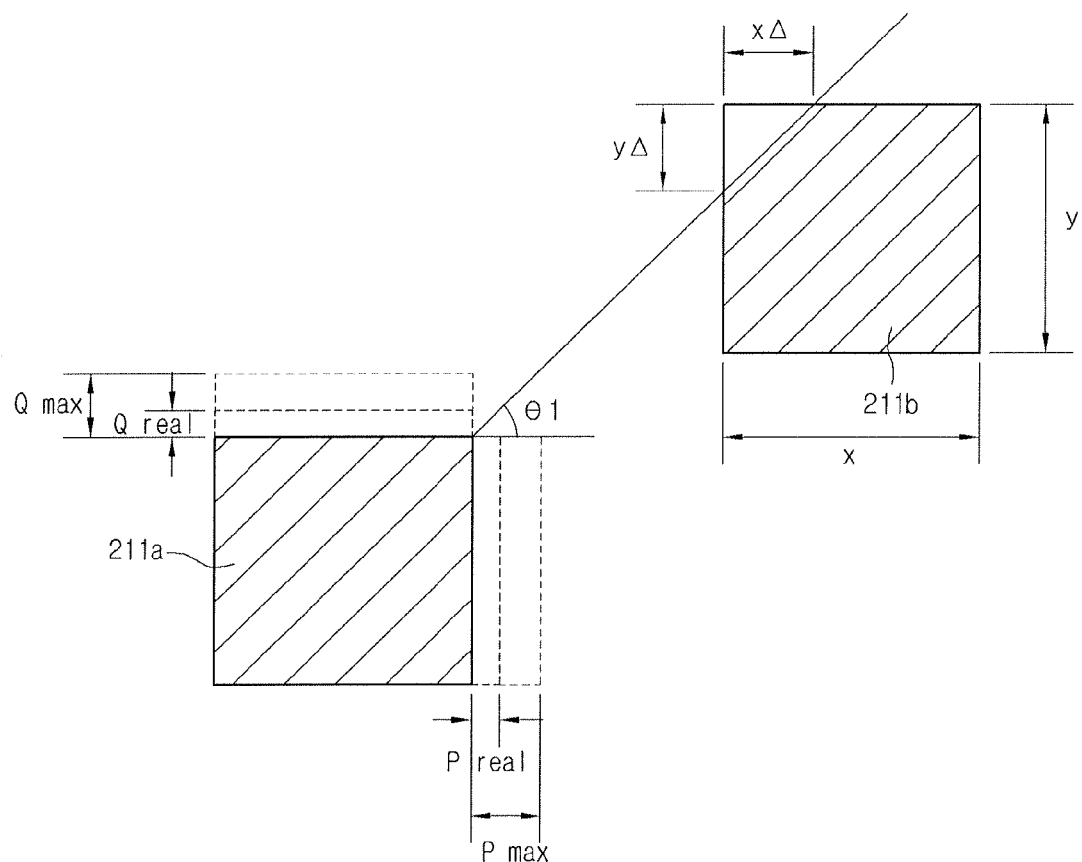
Figure 6:
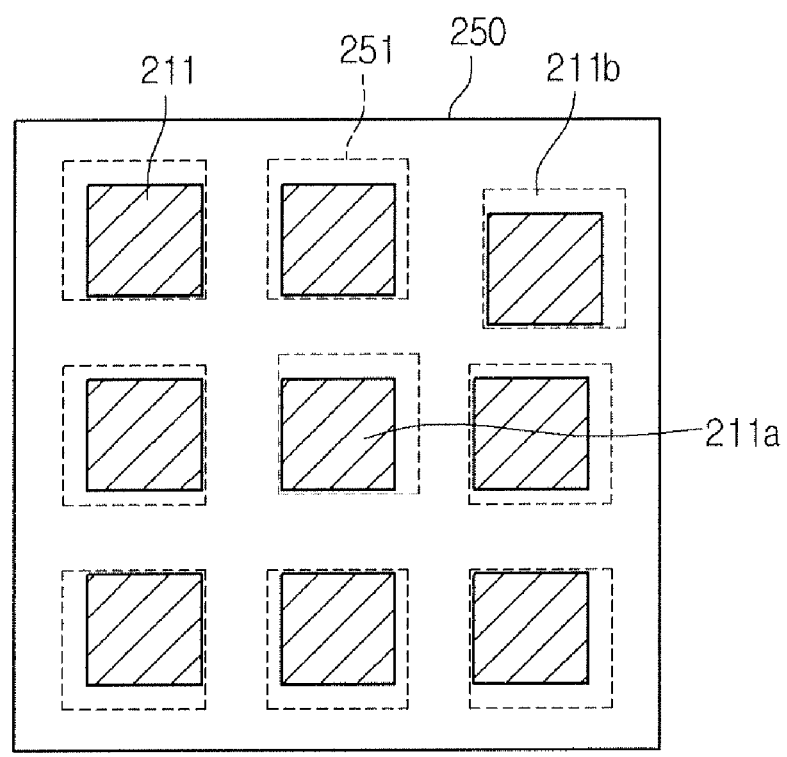
FIG. 6 is a plan view of the photo mask showing a mask pattern corrected by optimizing the mask bias according to an embodiment of the present invention, in order to form the design pattern of FIG. 3.

FIG. 3 is a plan view of the design pattern formed on a substrate according to another embodiment of the present invention, FIGS. 4 and 5 are views of an optimization method of a mask bias according to embodiments of the present invention, and FIG. 6 is a plan view of the photo mask showing a mask pattern corrected by optimizing the mask bias, in order to form the design pattern of FIG. 3.

Referring to FIG. 3, design patterns 211, 211a, and 211b on a substrate 200 can be densely formed with a size according to a regular rule.

For example, a design pattern of a quadrangular contact hole 211 is formed in a 3×3 (length and width) array on a portion of the substrate 200, where a non-array design pattern 211b is formed near the right upper end of a reference design pattern 211a.

At this time, when a 45° angle from an X axis line at a corner of the reference design pattern 211a does not conform to a corner of a design pattern (the non-array design pattern 211b), this design pattern is referred to as a non-array design pattern 211b.

Hereinafter, in order to make an optical proximity correction with the design pattern 211a, an optimization method of a bias will be described for use such as when drawing up a database DB.

Referring to FIG. 4, maximum values Pmax and Qmax of the X axis and the Y axis correction bias of the correction pattern are calculated by disposing the non-array design pattern 211b at the ideal a 45° angle position of the reference design pattern 211a.

Thereafter, referring to FIG. 5, the reference design pattern 211a is measured in the actual disposition location of the non-array design pattern 211b at the actual 45° angle position from the corner of the reference design pattern 211a most adjacent thereto.

The reference line in a 45° angle direction is drawn from a corner of the reference design pattern 211a to a non-array design pattern 211b closest thereto so that a triangular intersection pattern can be extracted from the non-array design pattern 211b.

If the lengths of the intersection pattern are Δx and Δy, the actual correction bias value Preal and Qreal in the X and Y axis directions of the reference pattern are calculated as $$\frac{\Delta x}{x} = \frac{Preal}{P\max} \text{ and } \frac{\Delta y}{y} = \frac{Qreal}{Q\max},$$

where x is the X axis direction length of the non-array pattern and y is the Y axis direction length of the non-array pattern.

FIG. 6 is a plan view of the photo mask for forming the design pattern of FIG. 3.

As shown in FIG. 6, in order to form a design pattern 211 on a substrate 200, a photo mask 250 according to an embodiment of the present invention is provided with a mask pattern 251 formed on the location corresponding to the design pattern 211.

When the design pattern 211 is not regularly disposed, an optimized actual correction bias value between a reference design pattern 211a and a non-array design pattern 211b is calculated.

The calculating method of the optimized actual correction bias value has been previously described with reference to FIGS. 4 and 5.

As described above, the present invention can manufacture a mask having an optimized correction bias value capable of forming a pattern in an excellent quality in a dense area where a micro design pattern in an irregular array state is formed.

Meanwhile, for embodiments when the design pattern 211 is regularly disposed, the optical proximity effect is selectively bias-corrected according to the intervals between adjacent patterns.

Therefore, in order to suppress the optical proximity effect of the design pattern and improve resolution thereof, the design of the mask pattern 251 is made by applying an Optical Proximity Correction (OPC) method.

Embodiments of the present invention have an effect that an accurate optical proximity correction is made so that a pattern can be formed in an excellent quality in a dense area where a micro design pattern in an irregular array state is formed.

Also, embodiments of the present invention have an effect to accurately form a desired design pattern using a mask designed according to an embodiment of the present invention regardless of an array state.

The manufacturing method of the mask and the optimization method of the mask bias according to the present invention is not limited to the disclosed embodiments. It would be appreciated by those skilled in the art that changes might be made in this embodiment without departing from the principles and spirit of the invention, the scope of which is defined in the claims and their equivalents. It should be understood that the examples and embodiments described herein are for illustrative purposes only and that various modifications or changes in light thereof will be suggested to persons skilled in the art and are to be included within the spirit and purview of this application.

What is claimed is:

1. A manufacturing method of a mask comprising:

extracting a reference pattern and a non-array pattern adjacent thereto from design patterns of a layer, the reference pattern and the non-array pattern being actual patterns of the design patterns of the layer, wherein the design patterns comprise the reference pattern, at least one array pattern disposed spaced by a predetermined interval from the reference pattern, and the non-array pattern disposed spaced at an irregular interval with respect to the reference pattern;

calculating correction bias maximum value Pmax from a first corner of the reference pattern to a Y axis in the direction of the non-array pattern and Qmax from a second corner of the reference pattern to an X axis in the direction of the non-array pattern;

extracting a triangular intersection pattern formed by intersecting a reference line with the non-array pattern, wherein the reference line is inclined at 45° from an X axis at a vertex of the reference pattern closest to the non-array pattern;

if the lengths of the triangular intersection pattern are given as Δx and Δy, calculating actual correction bias values Preal and Qreal of the reference pattern with equations $$\frac{\Delta x}{x} = \frac{Preal}{P\max} \text{ and } \frac{\Delta y}{y} = \frac{Qreal}{Q\max},$$

where x is the X axis direction length of the non-array pattern and y is the Y axis direction length of the non-array pattern; and manufacturing a mask having an optical proximity corrected (OPC) mask pattern by applying the actual correction bias values Preal and Qreal from the first and second corner, respectively.

2. The manufacturing method according to claim 1, wherein calculating the correction bias maximum values Pmax and Qmax comprises disposing the non-array pattern so that a vertex of the non-array pattern closest to the reference pattern is on the reference line.

3. The manufacturing method according to claim 1, wherein the design patterns comprise a contact hole pattern.

4. The manufacturing method according to claim 1, wherein the design patterns are quadrangular in shape.

5. The manufacturing method according to claim 1, wherein the mask pattern and the design pattern correspond to each other one to one, and the mask pattern is equal to or larger than the design pattern.

6. An optimization method of a mask bias comprising:

selecting a reference pattern and a non-array pattern adjacent to the reference pattern from design patterns of a layer, the reference pattern and the non-array pattern being actual patterns of the design patterns of the layer, wherein the design patterns comprise the reference pattern, at least one array pattern disposed spaced by a predetermined interval from the reference pattern, and the non-array pattern disposed spaced at an irregular interval with respect to the reference pattern;

calculating, via a computer system, an X axis and a Y axis correction bias maximum value Pmax and Qmax for a first corner and a second corner of the reference pattern adjacent to the non-array pattern;

extracting a triangular intersection pattern formed by intersecting a reference line with the non-array pattern, wherein the reference line is inclined at 45° from an X axis at a vertex of the reference pattern closest to the non-array pattern; and if the lengths of the triangular intersection pattern are given as Δx and Δy, calculating actual optimized correction bias values Preal and Qreal of the reference pattern with equations $$\frac{\Delta x}{x} = \frac{Preal}{P\max} \text{ and } \frac{\Delta y}{y} = \frac{Qreal}{Q\max},$$

where x is the X axis direction length of the non-array pattern and y is the Y axis direction length of the non-array pattern; and creating a mask pattern design by selectively applying the actual optimized correction bias values Preal and Qreal to the design patterns of the layer.

7. The optimization method according to claim 6, wherein calculating the correction bias maximum values Pmax and Qmax comprises disposing the non-array pattern so that a vertex of the non-array pattern closest to the reference pattern is on the reference line.

8. The optimization method according to claim 6, wherein design patterns of the predetermined design pattern configuration are quadrangular in shape.

* * * * *